United States Patent
Swarnkar et al.

(10) Patent No.: US 7,793,175 B1
(45) Date of Patent: Sep. 7, 2010

(54) AUTOMATED SCAN TESTING OF DDR SDRAM

(75) Inventors: Jitendra Swarnkar, San Jose, CA (US); Vincent Wong, Fremont, CA (US); Jie Du, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 314 days.

(21) Appl. No.: 11/972,567

(22) Filed: Jan. 10, 2008

Related U.S. Application Data (60) Provisional application No. 60/884,319, filed on Jan. 10, 2007.

(51) Int. Cl.
*G11C 29/00* (2006.01)

(52) U.S. Cl. .................................................. 714/718
(58) Field of Classification Search ................. 714/718, 714/710
See application file for complete search history.

(56) References Cited

U.S. PATENT DOCUMENTS

| | | | |
|---|---|---|---|
| 6,484,271 B1 * | 11/2002 | Gray | 714/6 |
| 6,724,668 B2 * | 4/2004 | Ohmura et al. | 365/200 |
| 7,454,670 B2 * | 11/2008 | Kim et al. | 714/710 |
| 7,478,285 B2 * | 1/2009 | Fouquet-Lapar | 714/42 |
| 7,661,044 B2 * | 2/2010 | Astigarraga et al. | 714/723 |
| 2003/0041295 A1 * | 2/2003 | Hou et al. | 714/710 |
| 2006/0101305 A1 * | 5/2006 | Corbin | 714/6 |
| 2009/0144583 A1 * | 6/2009 | Bruennert et al. | 714/7 |
| 2009/0164837 A1 * | 6/2009 | Swanson et al. | 714/6 |

* cited by examiner

*Primary Examiner*—James C Kerveros (57) ABSTRACT

A controller for scan testing a memory. The controller includes a control state machine for controlling the scan process, a test sequence stored in a random access memory used by the control state machine for controlling an actual memory test, a pattern generation data unit responsive to the control state machine for generating a test pattern that is written to and read from a memory under test, a configuration register read by the control state machine for configuring the controller and a fault location register written to by the control state machine for storing locations of defects in the memory. The controller is used to auto scan a memory in real time, interleaved with other processes accessing the memory. The controller has several modes of operation including operating in a periodic burst mode to conserve power and in a background mode so as not to interfere with other processes accessing the scanned memory.

18 Claims, 10 Drawing Sheets

AUTOMATED SCAN TESTING OF DDR SDRAM

CROSS-REFERENCE TO RELATED APPLICATION

This application claims the benefit of U.S. Provisional Patent Application No. 60/884,319 filed Jan. 10, 2007, the contents of which are hereby incorporated by reference as if fully stated herein.

FIELD OF THE INVENTION

The present invention relates to the automatic detection of defects in memory devices and more specifically to detection of defects in memory devices during runtime.

BACKGROUND OF THE INVENTION

Memory devices used in computing applications typically have a small number of unavoidable defects in memory cells that are created during the manufacturing process. Furthermore, defects in memory cells of memory devices can occur during the operational lifetime of the memory devices. To overcome these defects, Content Addressable Memory (CAM) schemes may be used to map the defective memory cells in a memory device such that the defects can be avoided during runtime. In a conventional Random Access Memory (RAM) device, a user supplies a memory address and the RAM device returns the data word stored at that address. In contrast, CAM is designed such that the user supplies a data word and the CAM searches the entire memory to see if that data word is stored anywhere in the memory. If the data word is found, the CAM returns a list of one or more storage addresses where the word was found (and in some architectures, it also returns the data word, or other associated pieces of data).

A defect mapping process may be used to fully test the memory device and map any defects that are found such that subsequent processes may use the memory while avoiding the defects. During defect mapping, the mapping process fully monopolizes the memory device being testing. Therefore, the defect mapping process is typically only used at the time of manufacture of the memory device before the memory device is released for use, or during some dedicated initialization step in a larger application or hardware initialization process. However, as the mapping process fully monopolizes the memory during mapping, the mapping process cannot be used during runtime as the mapping process would prevent other applications from accessing the memory device.

SUMMARY OF THE INVENTION

In general, in one aspect, the present invention addresses the foregoing situation through the use of an automated scan test of a Double Data Rate (DDR) Synchronous Dynamic Random Access Memory (SDRAM) performed in the background during runtime.

In another aspect of the invention, a controller for scan testing a memory includes a control state machine configured to control a memory scan of the memory, a writable control store storing a test sequence used by a test state machine to test a test region of the memory, a pattern generation data unit responsive to the test state machine for generating a test pattern used by the test state machine to test the test region of the memory, a configuration register read by the control state machine and a fault location register written to by the control state machine.

In another aspect of the invention, the control state machine is further configured to copy the test region of the memory into a replacement memory, the test state machine is further configured to perform a test scan on the test region of the memory using the test sequence and the control state machine is further configured to copy the replacement memory back into the test region of the memory.

In another aspect of the invention, the controller is further configured to receive a processor unit, a memory segment start address, and a memory segment end address; and the control state machine is further configured to scan the memory using a plurality of incremental test scans using the test sequence starting at the segment start address and ending at the segment end address.

In another aspect of the invention, the control state machine is further configured to wait between individual test scans.

In another aspect of the invention, the controller is further configured to receive from a processor unit a loop count; and the control state machine is further configured to repeat the test scans for a plurality of times according to the loop count.

In another aspect of the invention, the control state machine is further configured to wait between individual test scans.

In another aspect of the invention, the controller is further configured to operate in a background mode.

A more complete understanding of the invention can be obtained by reference to the following detailed description in connection with the attached drawings.

DETAILED DESCRIPTION OF THE PREFERRED EMBODIMENT

Figure 1:
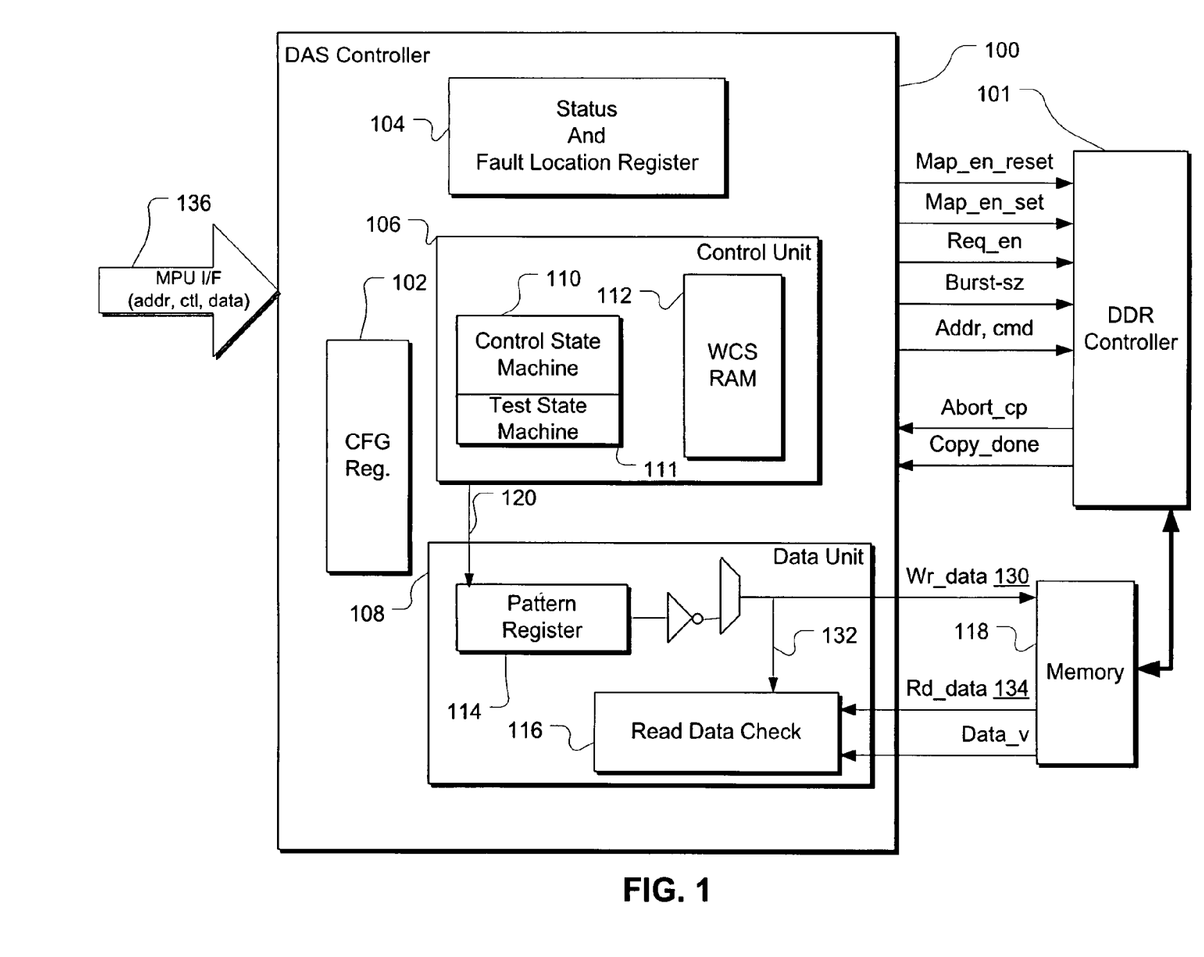
FIG. 1 is an architecture diagram of a DAS controller in accordance with an exemplary embodiment of the invention.

FIG. 1 is an architecture diagram of a DDR Auto Scan (DAS) controller 100 in accordance with an exemplary embodiment of the invention.

The DAS controller 100 controls the scan process. The DAS controller 100 is separate from a DDR controller 101; however the DAS controller 100 works in tandem with the DDR controller 101. In one implementation, the DDR controller 101 is used to temporarily store the data of the DDR SDRAM that are being scanned.

The DAS controller 100 includes configuration (CFG) registers 102, status and fault location registers 104, a control unit 106, and a data unit 108. The control unit 106 also includes a control state machine 110 and a test state machine 111. The test state machine 111 is programmable using operational instructions stored in a Writable Control Store (WCS) Random Access Memory (RAM) 112. The data unit 108 includes a pattern register 114 and a read data check unit 116.

Test flow is controlled by the control unit 106. The control unit 106 has two state machines to control the flow of the test. The control state machine 110, described in connection with FIG. 2A, controls the flow of the complete scan. The test state machine 111, described in FIG. 2B, performs the testing of memory 118. In one implementation, the test state machine 111 is triggered by the control state machine 110 when the control state machine 110 enters a "test in progress" state.

The control unit 106 controls the test using the test state machine 111. The test state machine 111 is responsible for generating control signals 120 transmitted to the data unit 108 and for updating the status and fault location register 104 as well.

In one implementation, the control unit 106 maintains the following counters:

"ddr_rd_cnt" keeps track of which read data belong to which address. The counter is loaded in a rd_cmd_burst size state and is decremented each time a ddr_rd_data is received.

"wcs_lpback_cnt" is used for stepping through the instructions stored in the WCS RAM 112. The counter is loaded when a loopback command is decoded. The value loaded into the counter comes from the WCS instruction when the instruction is decoded. The counter is decremented after each iteration.

"ddr_cmd_cnt" is used to keep track of a ddr_cmd that is issued. For example, to read, write or copy a 1K block of memory, the counter is loaded by 1K and is decremented by a burst size of the read, write or copy operation each time a burst is completed as indicated by an acknowledgement from the DDR controller 101.

The data unit 108 controls write data pattern generation and read data checking Write data pattern generation is done using the pattern register 114. The pattern register 114 is loaded by the control unit 106. The contents of the pattern register 114 can be shifted by 1 bit at a time. In one implementation, the shifting is controlled by a "shift_en_cu" signal from the control unit 106. The actual write data 130 written to the memory 118 can be a pattern stored in the pattern register 114, the inversion of the pattern stored in the pattern register 114, or all 0s. In one implementation, the selection of the pattern is controlled by the control unit 106 using a "data_select_cu" signal.

The data read from the memory 118 is checked against the expected data 132, which is generated in the same manner as the write data 130. In one implementation, if there is a mismatch between the read data 134 and the expected data 132, the control unit 106 is informed using an error signal "rd_err_du".

In one implementation, the DAS controller has following configuration, status and fault location registers:

DDR Auto Scan Segment Start Address (R/W)
DDR Auto Scan Segment End Address (R/W)
DDR Auto Scan current target Start Address (RO)
DDR Auto Scan current target offset Address (R0). This is a 10 bit register to point to a location within the 1 KB block.
DDR Auto Scan control
DDR Auto Scan Status
Interrupt mask
Fault locations In operation (in one implementation), the DAS controller 100 receives (136) a test sequence, a segment start and end address, and a test loop count from a microprocessor unit (MPU) (not shown). The MPU then transmits a ddr_scan_on signal to tell the DAS controller 100 to begin scanning the memory 118. The location of any defects found in the memory 118 are stored in the status and fault location register 104.

Figure 2A:
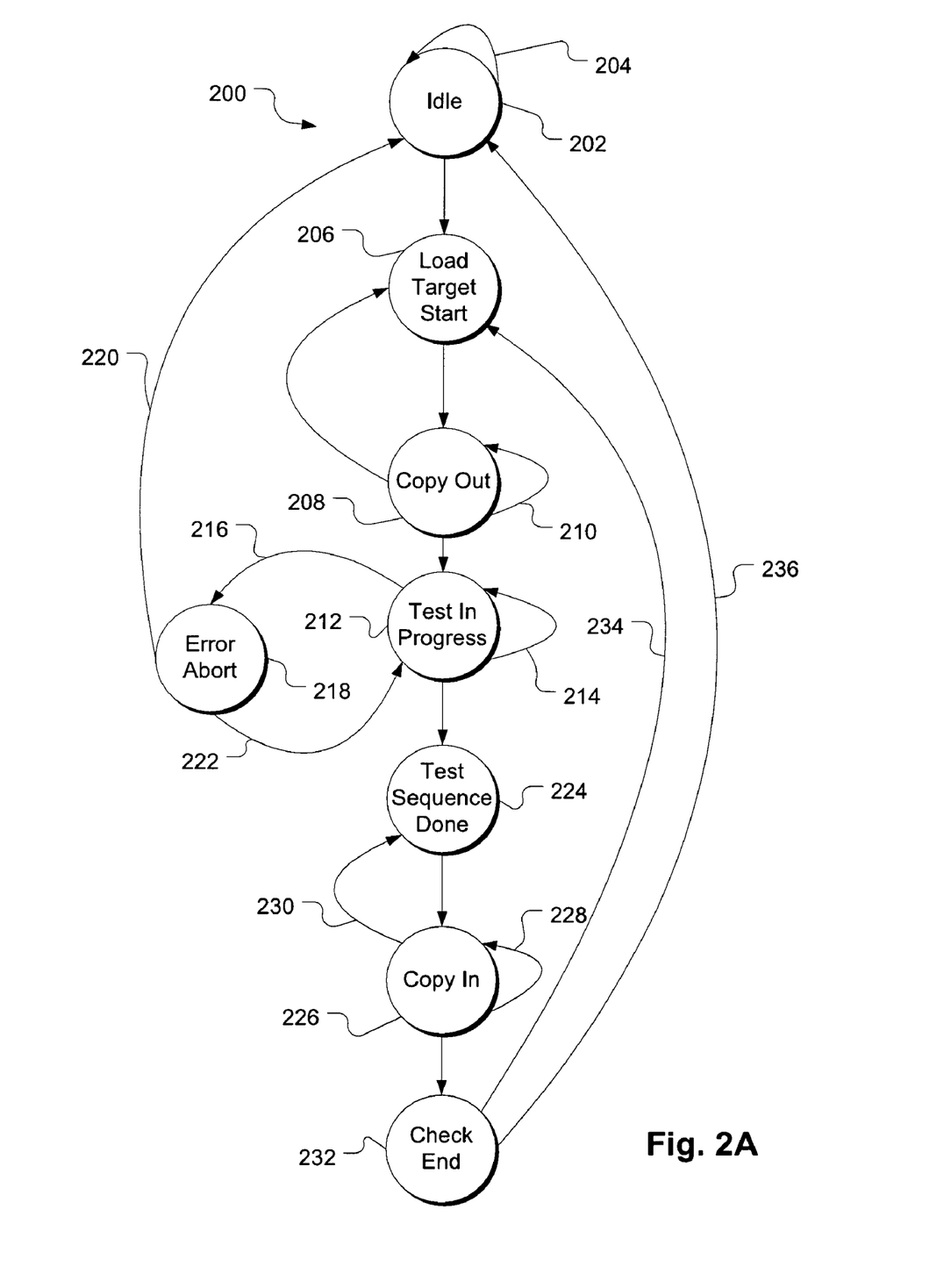
FIG. 2A is a state diagram of a control state machine in accordance with an exemplary embodiment of the invention.
Figure 3:
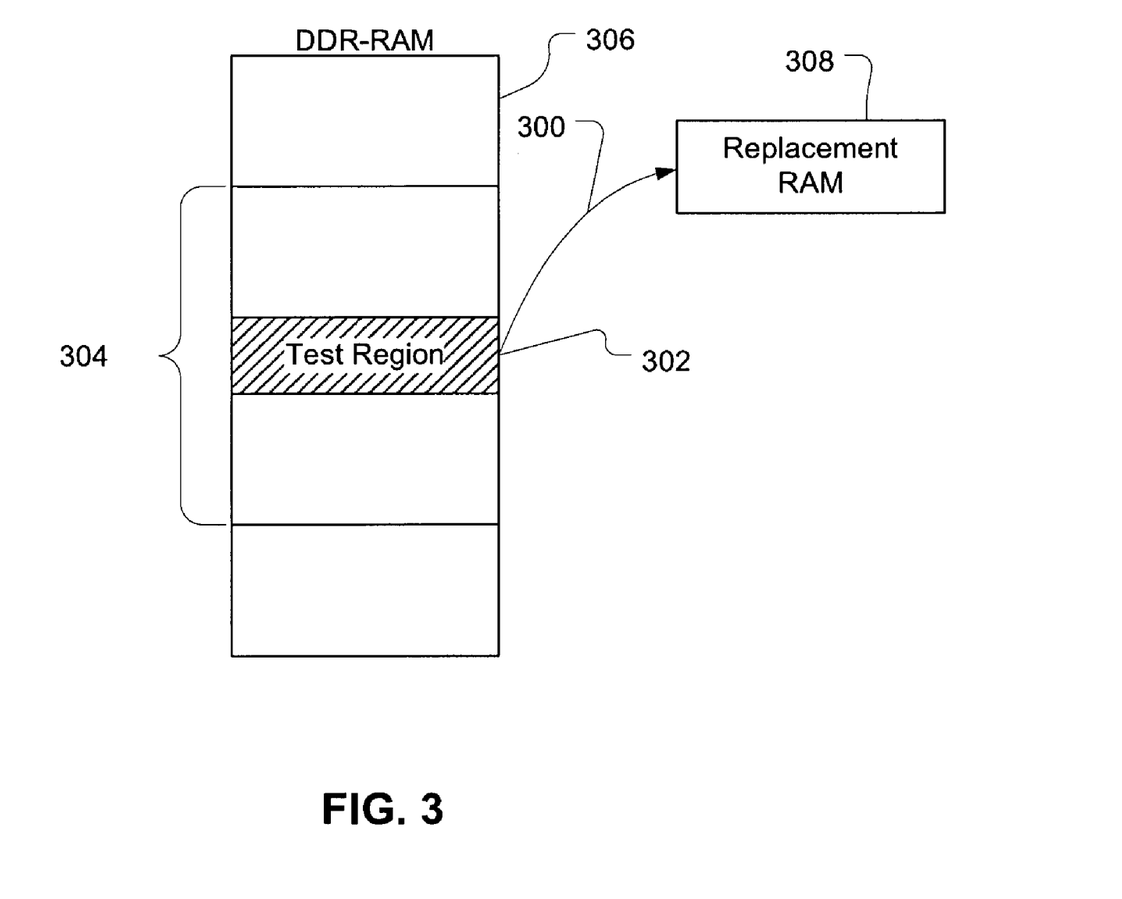
FIG. 3 is a memory diagram of a memory during a copy out operation in accordance with an exemplary embodiment of the invention.
Figure 4:
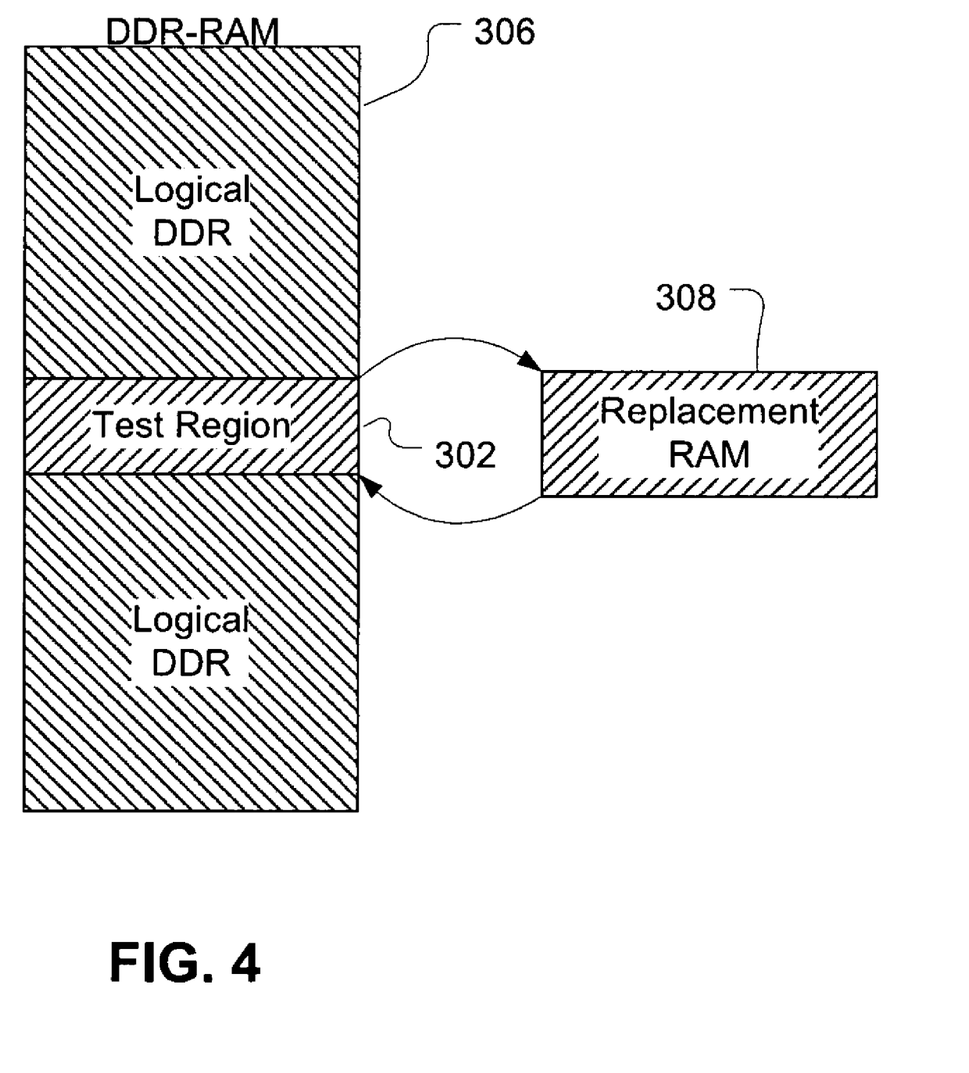
FIG. 4 is a memory diagram of a memory during testing in accordance with an exemplary embodiment of the invention.
Figure 5:
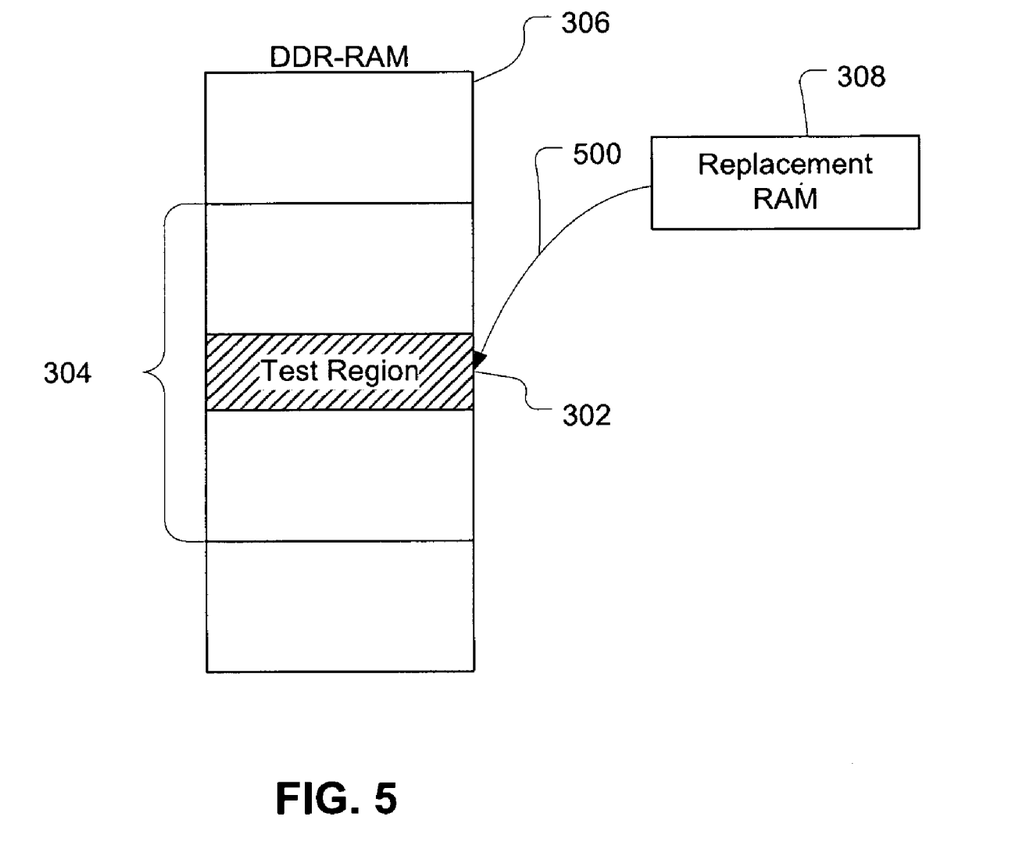
FIG. 5 is a memory diagram of a memory during a copy in operation in accordance with an exemplary embodiment of the invention.

Having described the structure of the DAS controller 100 in reference to FIG. 1, one implementation, of the test control and testing operations of the DAS controller 100 will now be described in reference to FIG. 2A, FIG. 3, FIG. 4 and FIG. 5 where FIG. 2A is a state diagram of a control state machine 200, FIG. 3 is a memory diagram of a memory 306 during a copy out operation, FIG. 4 is a memory diagram of memory 306 during testing and FIG. 5 is a memory diagram of memory 306 during a copy in operation.

Referring now to FIG. 2, the control state machine 200 waits in a wait state 202 while a scan enable signal 204 is low. The control state machine 200 then transitions to a load target start state 206 where the control state machine 200 loads a start address for scanning of a memory (not shown).

Referring now to FIG. 3 as well as FIG. 2A, the control state machine 200 then transitions to a copy out state 208 where the control state machine copies (300) the contents of a test region 302 of memory out of a segment 304 (of memory 306) to be scanned. The test region 302 is copied into an on-chip replacement RAM 308. During the scan test, test region 302 is not accessible by an application using memory 306. Instead, DAS controller 100 maps locations in test region 302 to replacement RAM 308 in a manner transparent to the application. Hence, although replacement RAM 308 and memory 306 are two separate physical entities, during the scan test, replacement RAM 308 become a single logical entity. The control state machine 200 continues the copying while an abort copy signal and copy complete signal 210 remain low.

Referring now to FIG. 4 as well as FIG. 2A, when the copy complete signal 210 goes high, the control state machine 200 transitions to a test in progress state 212 where a test state machine (described in connection with FIG. 2B) executes the actual test of the test region 302. The control state machine 200 remains in the test in progress state 212 while a test sequence done signal 214 remains low. If an error signal 216 is detected, the control state machine 200 transitions to an error abort state 218. If an abort on error signal 220 is detected the control state machine 200 returns to the idle state 202. However, if a continue on error signal 222 is detected, the control state machine 200 returns to the test in progress state 212.

Referring now to FIG. 5 as well as FIG. 2A, when the test sequence done signal 214 goes high, the control state machine 200 transitions to a test sequence done state 224 and then a copy in state 226. While a copy in completed signal and abort copy signal 228 remain low, the control state machine 200 copies (500) the contents of on-chip replacement RAM 308 back into the test region 302 of segment 304 of memory 306. If a copy abort signal 230 goes high, the control state machine 200 transitions back (236) to the test sequence done state 224.

If the copy in is successful, the control state machine 200 transitions to a check end state 232. If a segment end is reached and a test count has not been exceeded, the control state machine 200 transitions back to the load target start state 206 and loads the starting address of a new segment of the memory to test. However, if the segment end is reached and the test count is exceeded, the control state machine 200 transitions (236) back to the idle state 202.

In one embodiment of DAS controller 100 a burst size for the auto scan request is not more than the other agent in the same slot. Furthermore, the DAS controller 100 is placed in the lowest priority request channel in its slot. In this way, the DAS controller operations will have little or no impact on overall system performance.

In another embodiment of DAS controller 100, if there is any attempt by another device to write to a scan test region, the control state machine 200 will abort the copy out operation and wait for a period of time before restarting the copy out from the beginning of the scan test region.

In another embodiment of DAS controller 100, if an error is reported during testing, the control state machine 200 will stop and raise status and/or interrupts for the MPU to intervene. The MPU can abort the test or resume the test by programming a specified control bit.

In another embodiment of DAS controller 100, if another device attempts to write to the scan test region during the copy in, the control state machine 200 will abort the copy in and wait for a period of time and re-start the copy in from the beginning of the scan test region.

In another embodiment of DAS controller 100, the start and end addresses of a memory segment to be tested can be programmatically set allowing the DAS controller to test all or part of a memory device.

In another embodiment of DAS 100, the DAS controller 100 operates in the background mode compared to other processes accessing a memory device being scanned. In this way, the DAS controller 100 does not interfere with the other processes' use of the memory device.

In another embodiment of DAS controller 100, the DAS controller 100 only utilizes side bandwidth of a processing system that has not already been allocated to higher priority applications.

In another embodiment of DAS controller 100, the testing is performed periodically, interleaving burst modes and waiting modes, in order to conserve energy.

Figure 2B:
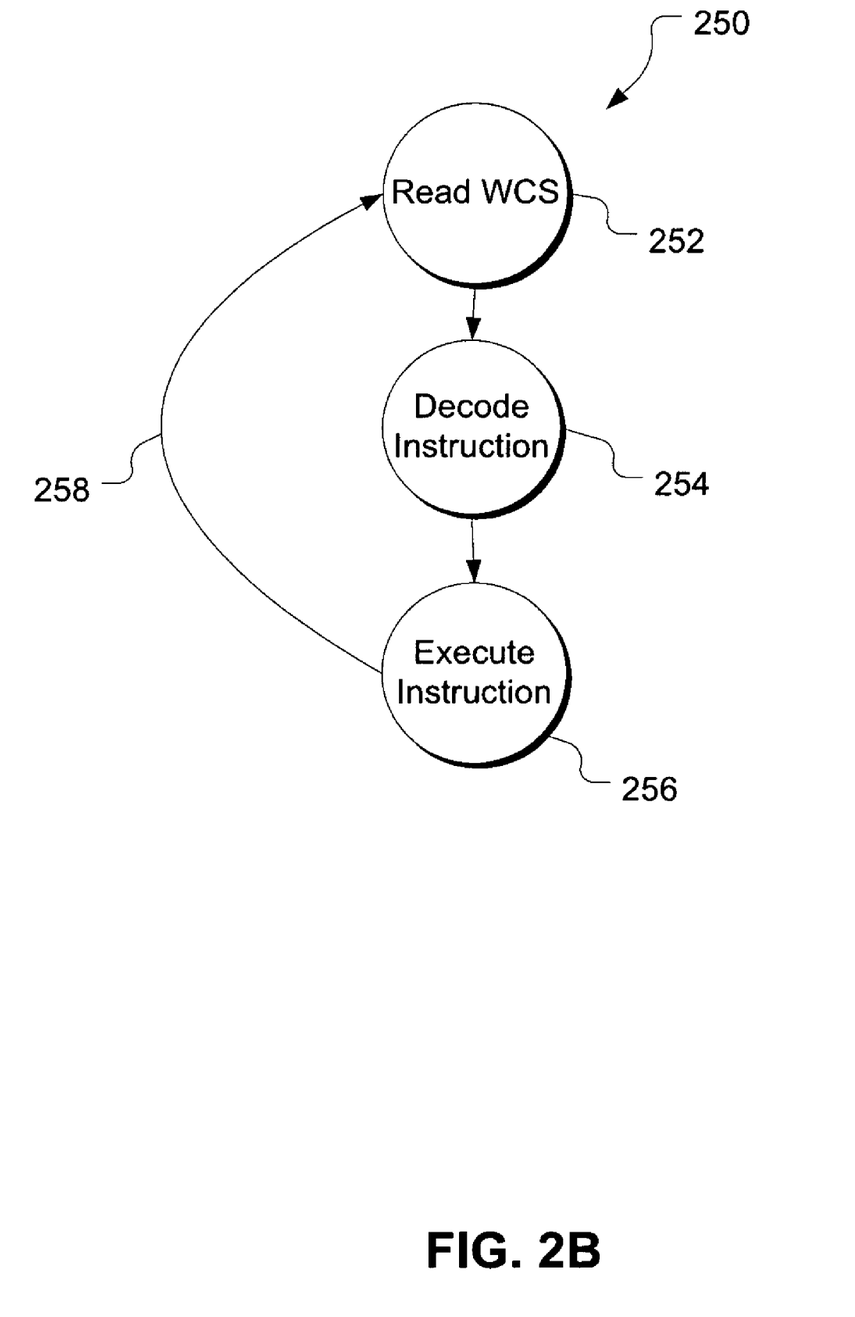
FIG. 2B is a state diagram of a test state machine in accordance with an exemplary embodiment of the invention.

Turning now to FIG. 2B, FIG. 2B is a state diagram of a test state machine 250 in accordance with an exemplary embodiment of the invention. In one implementation, the test state machine 250 is started in the test in progress state 212 (of FIG. 2A) and reads instructions stored in the WCS RAM 112 (of FIG. 1) to implement test scans performed on the memory 118 (of FIG. 1).

In a read WCS state 252, the test state machine 250 reads an instruction out of the WCS RAM 112. In a decode instruction state 254, the test state machine 250 decodes the instruction read out of the WCS RAM 112. In an execute state, the test state machine 250 executes the instruction read out of the WCS RAM. If there are more instructions to read out, the test state machine transitions (258) to the read WCS state 252.

In one implementation, the use of a WCS RAM 112 allows a DAS controller to generate different test patterns. For example, instructions for a walking 1, walking 0 or any fixed pattern may be programmed into the WCS RAM 112.

In one embodiment of DAS controller 100, a modified walking 1 pattern is used. As a typical DDR memory has a 32 bit word size, a 32 bit pattern of "0x0000_00001" is loaded into a pattern register and shifted by 1 for each location in a scanned memory segment so that every location will receive a unique pattern. However, after 32 locations, the pattern will start repeating. Hence, the pattern won't be unique anymore. To overcome this, after 32 locations, an inverted version of the pattern is used. This way 64 word locations (of 32 bits each) can be tested. As a 1 KB block of a scanned memory will have 128 words, the block can be tested in 2 parts. In this case, the instructions for the test sequence are:

INIT (Fill with all 0s)

Test a first half of the block of memory using a walking 1 test pattern

INIT and test $2^{nd}$ half of the memory block

As another example of a programmable test pattern, a walking 0 pattern can be implemented in a similar manner as the modified walking 1 pattern as discussed above.

Walking 1 and 0 patterns will catch almost all issues related to decoding problems or word-line interference in a memory device. To make the test pattern more robust, the test can be repeated 32 times each time such that the starting pattern can be shifted so that each bit in the wordline is stressed.

Alternatively, an all toggle pattern can be used which will toggle bits within a wordline. Such a pattern will catch interference among bit cells within the wordline as well as interference among the bit cells of the neighboring wordlines.

In order to accommodate different sequences, test sequences are programmed by firmware using WCS RAM 112. The code from the WCS RAM 112 is executed by the DAS controller 100 when the control state machine 200 reaches the test in progress state 214 (both of FIG. 2A).

The following tables are illustrative of commands and variables used to program WCS RAM 112 in accordance with an exemplary embodiment of the invention and are presented by way of illustration and not of limitation.

TABLE 1

| Command field definitions: | |
| --- | --- |
| Command | Definition |
| 000 | Marching |
| 001 | Walking |
| 010 | Loop Back N Times |
| 011 | Set Address |
| 100 | Write Pattern Lower Byte |
| 101 | Write Pattern Higher Byte |
| 110 | INIT(filing with 0s) |

TABLE 2

| Marching command variables: | | | |
| --- | --- | --- | --- |
| Operation | $1^{st}$ Op Data | $2^{nd}$ Op Data | Address Change |
| 000: Single Read | 0: Pattern<br>1: ~Pattern | N/A | 00: No Change<br>01: Increment by 2<br>10: Decrement by 2 |
| 001: Burst Read<br>(or, Read All) | 0: Pattern<br>1: ~Pattern | N/A | N/A |
| 010: Single Write | 0: Pattern<br>1: ~Pattern | N/A | 00: No Change<br>01: Increment by 2<br>10: Decrement by 2 |
| 011: Burst Write<br>(or, Write All) | 0: Pattern<br>1: ~Pattern | N/A | N/A |
| 100: Read Write | 0: Pattern<br>1: ~Pattern | 0: Pattern<br>1: ~Pattern | 00: No Change<br>01: Increment by 2<br>10: Decrement by 2 |
| 101: Read Read | 0: Pattern<br>1: ~Pattern | 0: Pattern<br>1: ~Pattern | 00: No Change<br>01: Increment by 2<br>10: Decrement by 2 |

TABLE 2-continued

Marching command variables:

| Operation | 1st Op Data | 2nd Op Data | Address Change |
|---|---|---|---|
| 110: Write Write | 0: Pattern<br>1: ~Pattern | 0: Pattern<br>1: ~Pattern | 00: No Change<br>01: Increment by 2<br>10: Decrement by 2 |
| 111: Write Read | 0: Pattern<br>1: ~Pattern | 0: Pattern<br>1: ~Pattern | 00: No Change<br>01: Increment by 2<br>10: Decrement by 2 |

TABLE 3

Loop back command variable:

| Loop Back Instruction Number | Loop Count |
|---|---|
| 00000: 1 Instruction | 00: Once |
| ... | ... |
| 11111: 32 Instructions | FF: 256 Times |

A set address command sets the starting address of subsequent WCS instructions. A write pattern command writes the pattern (16 bit) for subsequent WCS instructions. For example, to program a walking 1 test followed by a marching increment, in one implementation, the WCS instructions are as follows:

Set_Addr 0x0000; // Start at 0x0000 offset
Write_Pattern_L 0x01;
Write_Pattern_H 0x00; // data pattern 0x0001
... Walking1 sequence ...; // walking 1 for the whole 1K page
Set_Addr 0000; // Start at 0x0000 offset
Write_Pattern_L 0x55;
Write_Pattern_H 0x00; // data pattern 0x0055
Marching, burst_write, pattern;
Loop_back, 1, 32; // W(D) for the whole 1K page
Marching, single_read, pattern, no_change;
Marching, write_read, !pattern, !pattern, inc;
Loop_back, 2, 256; // R(D)W(!D)R(!D) for the whole 1K page
Marching, single_read !pattern; no_change;
Marching, write_read, pattern, pattern inc;
Loop_back, 2, 256; //R(!D)W(D)R(D) for the whole 1K page
Marching, burst_read, pattern;
Loop_back, 1, 32; // R(D) for the whole page In a memory management system employing DAS controller 100 in accordance with an exemplary embodiment of the invention, a buffer manager will have a SRAM to temporarily store the data of the test target block of the DDR memory. In one implementation, the DAS controller 100 will have a configuration bit "ddr2sram_map_en", upon setting of which the buffer manager will automatically route any request to the test target block of the DDR memory to the ASRAM as illustrated in FIG. 4.

The buffer manager decodes the copy out or copy in command and treats the command as if the requesting agent is ASRAM, for example, data source (for copy in) or data sink (for copy out) is ASRAM. The command to the buffer manager has the following 2 bit encoding:

00: DDR Write, data from requesting agent
01: DDR Read, data goes to requesting agent
10: DDR Write for copy in, data comes from ASRAM
11: DDR Read for copy out, read data to ASRAM In a memory management system employing DAS controller 100 in accordance with an exemplary embodiment of the invention, during the auto scan by the DAS controller 100, if any location in memory is detected as a faulty location, the address of the location will be stored in the buffer manager and the location's contents will be stored in local SRAM. Subsequently, all access requests to the DDR memory will be snooped and if the address of the faulty location is hit, then the access will be routed to this local SRAM.

To perform this operation, an 8 deep CAM can be used where faulty location addresses are stored as contents of CAM.

As the DDR memory read has a 3 clock cycle latency, the CAM searching need not to be finished in single cycle. Therefore, as a simple alternative to CAM, the faulty location address can be stored in registers and 8 comparators can be used to check a hit. Then, the $2^{nd}$ cycle can be used to read the data of that location from the local SRAM.

Figure 6A:
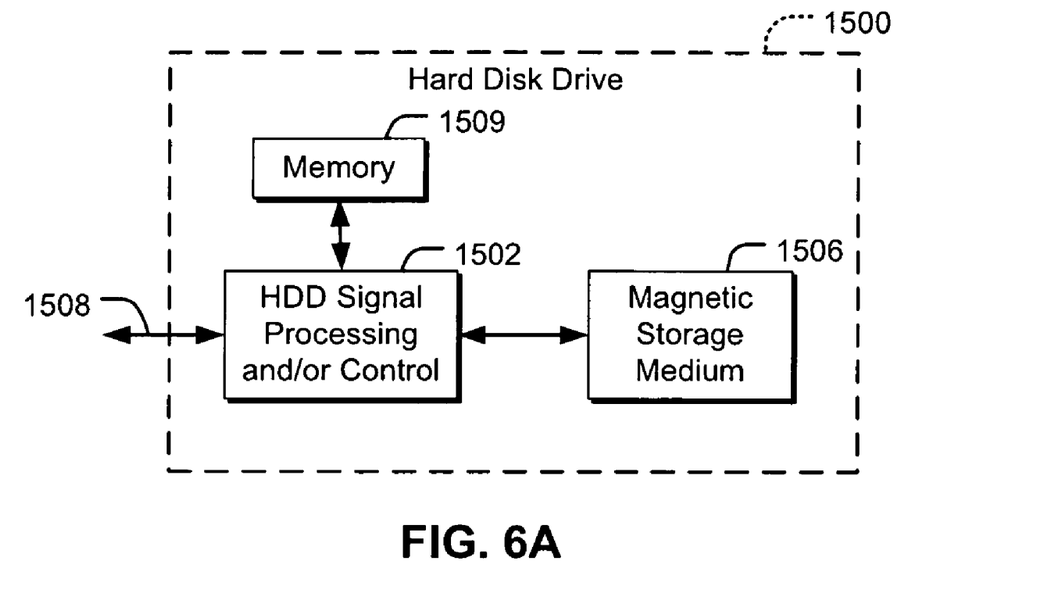
FIG. 6A is a block diagram showing an embodiment of the invention in a hard disk drive.

Referring now to FIGS. 6A-6H, various exemplary implementations of the present invention are shown. Referring to FIG. 6A, the present invention may be embodied as a DAS controller in a hard disk drive (HDD) 1500. The present invention may be implemented as part of either or both signal processing and/or control circuits, which are generally identified in FIG. 6A at 1502. In some implementations, signal processing and/or control circuit 1502 and/or other circuits (not shown) in HDD 1500 may process data, perform coding and/or encryption, perform calculations, and/or format data that is output to and/or received from a magnetic storage medium 1506.

HDD 1500 may communicate with a host device (not shown) such as a computer, mobile computing devices such as personal digital assistants, cellular phones, media or MP3 players and the like, and/or other devices via one or more wired or wireless communication links 1508. HDD 1500 may be connected to memory 1509, such as random access memory (RAM), a low latency nonvolatile memory such as flash memory, read only memory (ROM) and/or other suitable electronic data storage.

Figure 6B:
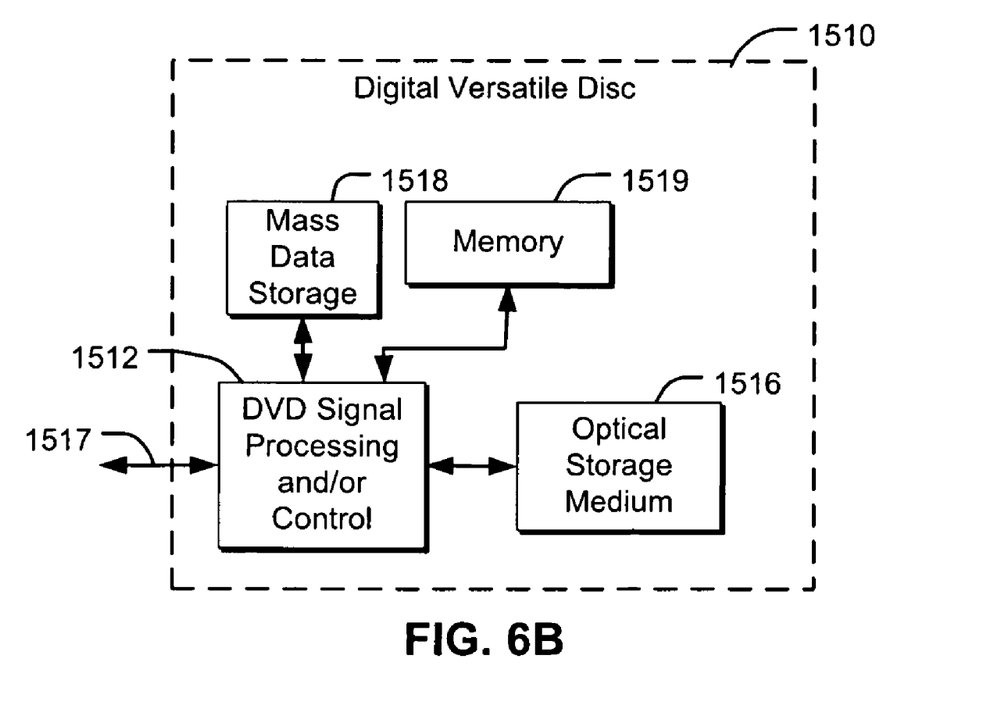
FIG. 6B is a block diagram showing an embodiment of the invention in a DVD drive.

Referring now to FIG. 6B, the present invention may be embodied as a DAS controller in a digital versatile disc (DVD) drive 1510. The present invention may be implemented as part of either or both signal processing and/or control circuits, which are generally identified in FIG. 6B at 1512, and/or mass data storage 1518 of DVD drive 1510. Signal processing and/or control circuit 1512 and/or other circuits (not shown) in DVD 1510 may process data, perform coding and/or encryption, perform calculations, and/or format data that is read from and/or data written to an optical storage medium 1516. In some implementations, signal processing and/or control circuit 1512 and/or other circuits (not shown) in DVD 1510 can also perform other functions such as encoding and/or decoding and/or any other signal processing functions associated with a DVD drive.

DVD drive 1510 may communicate with an output device (not shown) such as a computer, television or other device via one or more wired or wireless communication links 1517. DVD 1510 may communicate with mass data storage 1518 that stores data in a nonvolatile manner. Mass data storage 1518 may include a hard disk drive (HDD) such as that shown in FIG. 6A. The HDD may be a mini HDD that includes one or more platters having a diameter that is smaller than approximately 1.8". DVD 1510 may be connected to memory 1519, such as RAM, ROM, low latency nonvolatile memory such as flash memory, and/or other suitable electronic data storage.

Figure 6C:
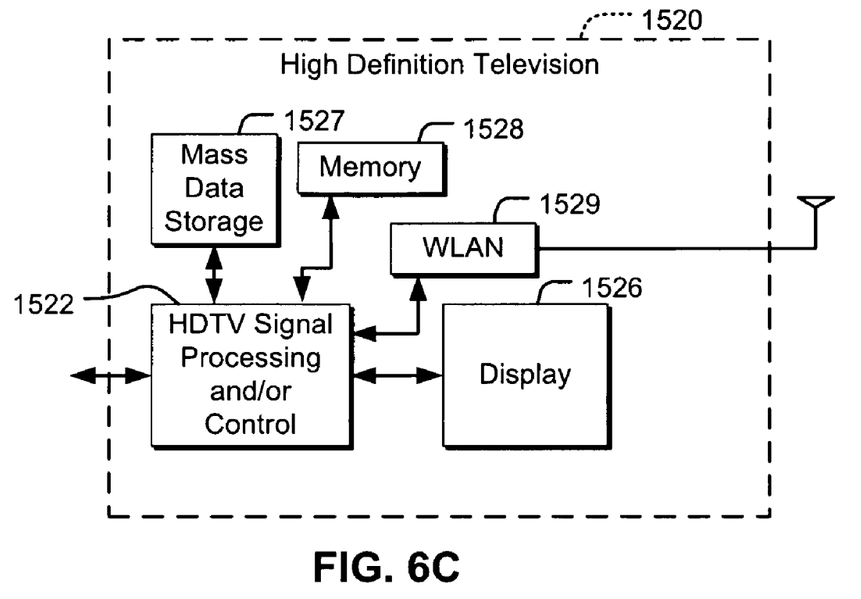
FIG. 6C is a block diagram showing an embodiment of the invention in a high definition television (HDTV).

Referring now to FIG. 6C, the present invention may be embodied as a DAS controller in a high definition television (HDTV) 1520. The present invention may be implemented as part of either or both signal processing and/or control circuits, which are generally identified in FIG. 6C at 1522, a WLAN interface and/or mass data storage 1527 of the HDTV 1520. HDTV 1520 receives HDTV input signals in either a wired or wireless format and generates HDTV output signals for a display 1526. In some implementations, signal processing circuit and/or control circuit 1522 and/or other circuits (not shown) of HDTV 1520 may process data, perform coding and/or encryption, perform calculations, format data and/or perform any other type of HDTV processing that may be required.

HDTV 1520 may communicate with mass data storage 1527 that stores data in a nonvolatile manner such as optical and/or magnetic storage devices. At least one HDD may have the configuration shown in FIG. 6A and/or at least one DVD may have the configuration shown in FIG. 6B. The HDD may be a mini HDD that includes one or more platters having a diameter that is smaller than approximately 1.8". HDTV 1520 may be connected to memory 1528 such as RAM, ROM, low latency nonvolatile memory such as flash memory and/or other suitable electronic data storage. HDTV 1520 also may support connections with a WLAN via a WLAN network interface 1529.

Figure 6D:
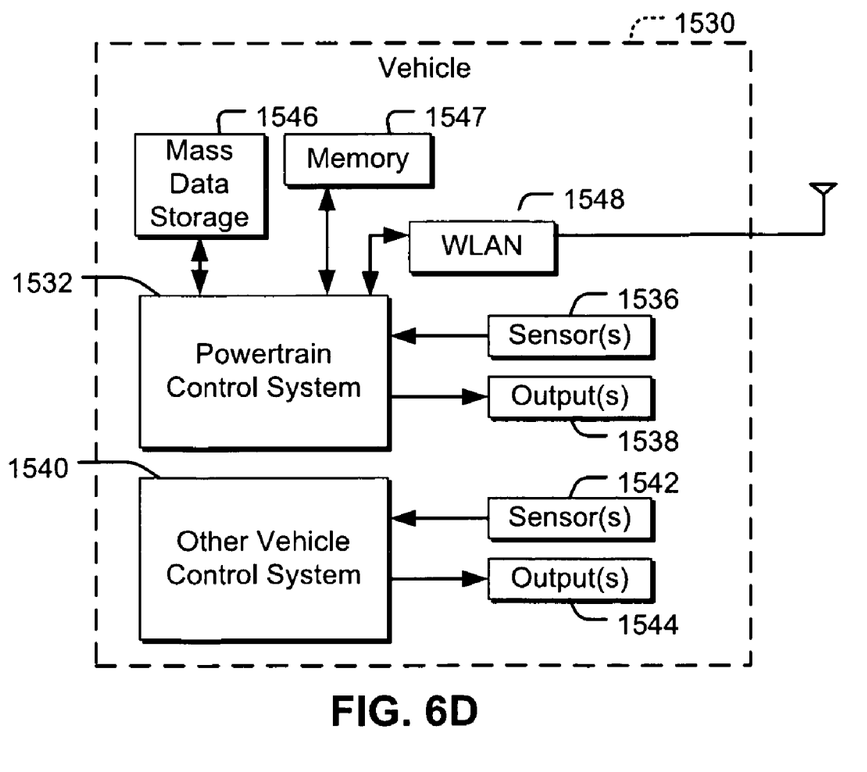
FIG. 6D is a block diagram showing an embodiment of the invention in a vehicle control system.

Referring now to FIG. 6D, the present invention may be embodied as a DAS controller in a vehicle control system 1530, a WLAN interface and/or mass data storage 1546 of the vehicle control system 1530. In some implementations, the present invention is implemented as part of a powertrain control system 1532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 1540 of vehicle 1530. Control system 1540 may likewise receive signals from input sensors 1542 and/or output control signals to one or more output devices 1544. In some implementations, control system 1540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1532 may communicate with mass data storage 1546 that stores data in a nonvolatile manner. Mass data storage 1546 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Powertrain control system 1532 may be connected to memory 1547 such as RAM, ROM, low latency nonvolatile memory such as flash memory and/or other suitable electronic data storage. Powertrain control system 1532 also may support connections with a WLAN via a WLAN network interface 1548. The control system 1540 may also include mass data storage, memory and/or a WLAN interface (all not shown).

Figure 6E:
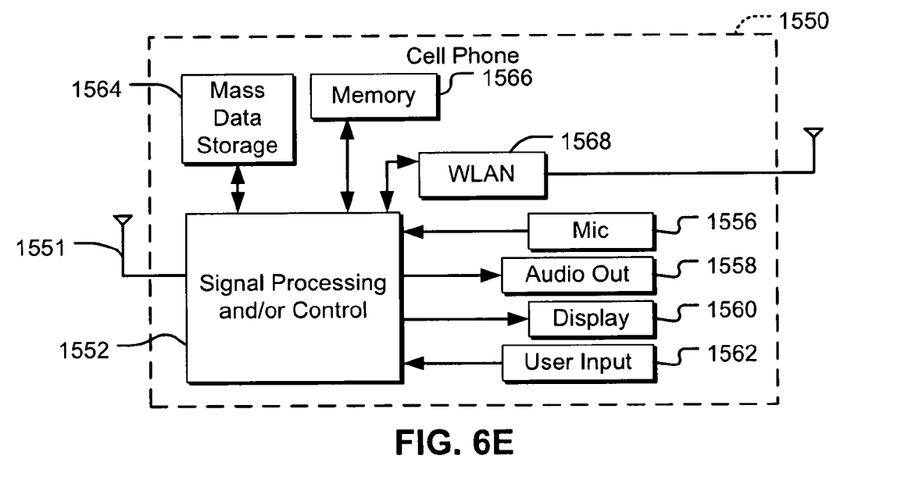
FIG. 6E is a block diagram showing an embodiment of the invention in a cellular or mobile phone.

Referring now to FIG. 6E, the present invention may be embodied as a DAS controller in a cellular phone 1550 that may include a cellular antenna 1551. The present invention may be implemented as part of either or both signal processing and/or control circuits, which are generally identified in FIG. 6E at 1552, a WLAN interface and/or mass data storage of the cellular phone 1550. In some implementations, cellular phone 1550 includes a microphone 1556, an audio output 1558 such as a speaker and/or audio output jack, a display 1560 and/or an input device 1562 such as a keypad, pointing device, voice actuation and/or other input device. Signal processing and/or control circuits 1552 and/or other circuits (not shown) in cellular phone 1550 may process data, perform coding and/or encryption, perform calculations, format data and/or perform other cellular phone functions.

Cellular phone 1550 may communicate with mass data storage 1564 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Cellular phone 1550 may be connected to memory 1566 such as RAM, ROM, low latency nonvolatile memory such as flash memory and/or other suitable electronic data storage. Cellular phone 1550 also may support connections with a WLAN via a WLAN network interface 1568.

Figure 6F:
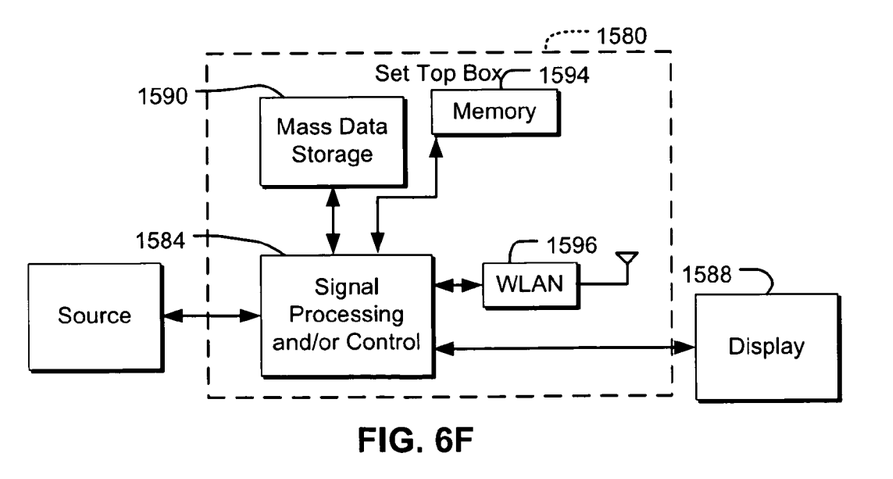
FIG. 6F is a block diagram showing an embodiment of the invention in a set-top box (STB).

Referring now to FIG. 6F, the present invention may be embodied as DAS controller in a set top box 1580. The present invention may be implemented as part of either or both signal processing and/or control circuits, which are generally identified in FIG. 6F at 1584, a WLAN interface and/or mass data storage 1590 of the set top box 1580. Set top box 1580 receives signals from a source such as a broadband source and outputs standard and/or high definition audio/video signals suitable for a display 1588 such as a television and/or monitor and/or other video and/or audio output devices. Signal processing and/or control circuits 1584 and/or other circuits (not shown) of the set top box 1580 may process data, perform coding and/or encryption, perform calculations, format data and/or perform any other set top box function.

Set top box 1580 may communicate with mass data storage 1590 that stores data in a nonvolatile manner. Mass data storage 1590 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Set top box 1580 may be connected to memory 1594 such as RAM, ROM, low latency nonvolatile memory such as flash memory and/or other suitable electronic data storage. Set top box 1580 also may support connections with a WLAN via a WLAN network interface 1596.

Figure 6G:
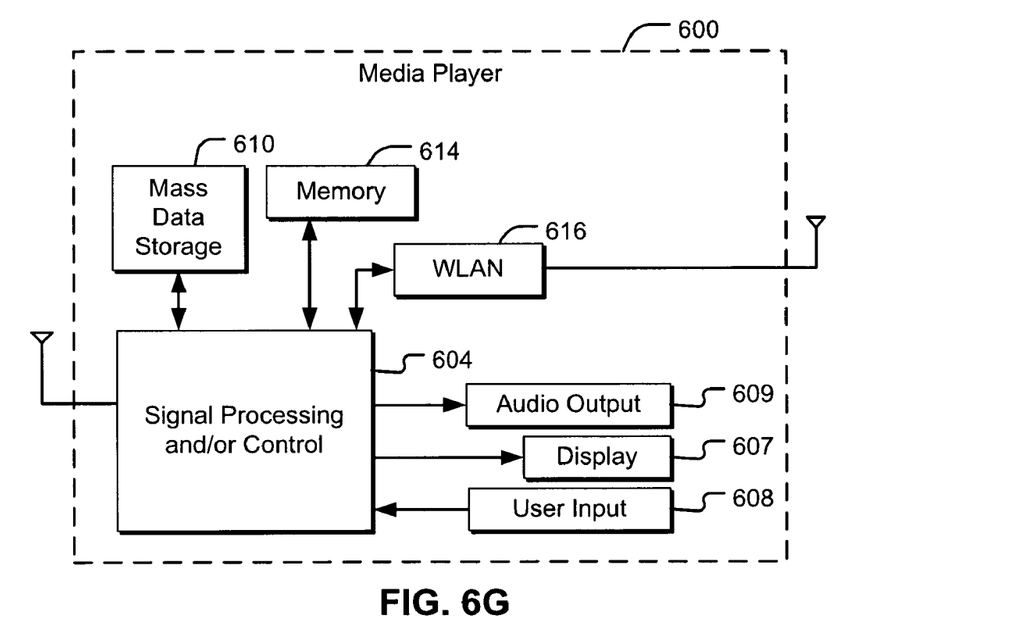
FIG. 6G is a block diagram showing an embodiment of the invention in a media player.

Referring now to FIG. 6G, the present invention may be embodied as a DAS controller in a media player 600. The present invention may be implemented as part of either or both signal processing and/or control circuits, which are generally identified in FIG. 6G at 604, a WLAN interface and/or mass data storage 610 of the media player 600. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function.

Media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage 610 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Media player 600 may be connected to memory 614 such as RAM, ROM, low latency nonvolatile memory such as flash memory and/or other suitable electronic data storage. Media player 600 also may support connections with a WLAN via a WLAN network interface 616. Still other implementations in addition to those described above are contemplated.

Figure 6H:
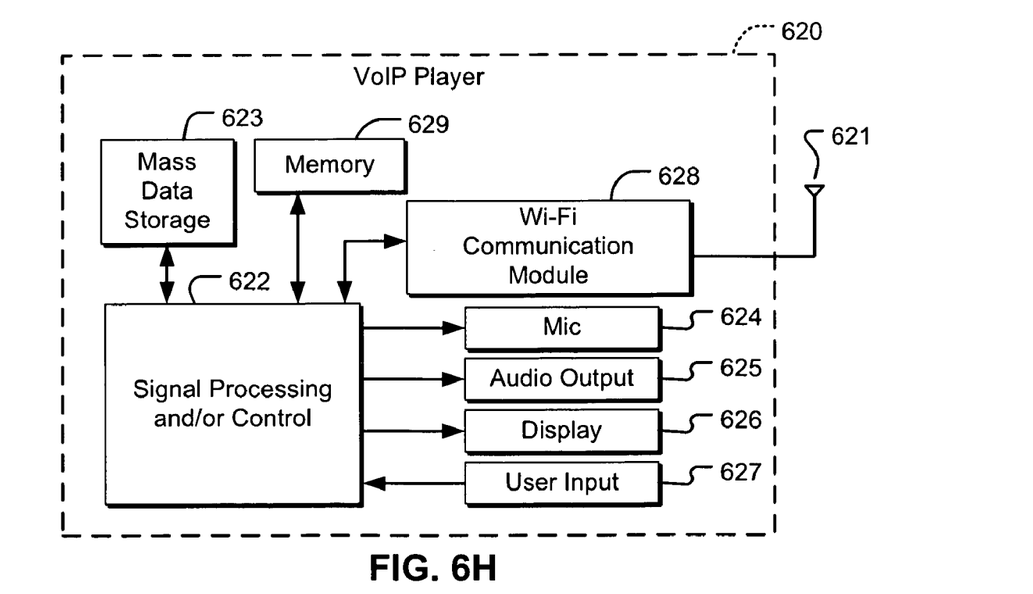
FIG. 6H is a block diagram showing an embodiment of the invention in a VoIP player.

Referring to FIG. 6H, the present invention may be embodied as a DAS controller in a Voice over Internet Protocol (VoIP) phone 620 that may include an antenna 621.

The present invention may be implemented as part of either or both signal processing and/or control circuits, which are generally identified in FIG. 6H at 622, a wireless interface and/or mass data storage 623 of the VoIP phone 620. In some implementations, VoIP phone 620 includes, in part, a microphone 624, an audio output 625 such as a speaker and/or audio output jack, a display monitor 626, an input device 627 such as a keypad, pointing device, voice actuation and/or other input devices, and a Wireless Fidelity (Wi-Fi) communication module 628. Signal processing and/or control circuits 622 and/or other circuits (not shown) in VoIP phone 620 may process data, perform coding and/or encryption, perform calculations, format data and/or perform other VoIP phone functions.

VoIP phone 620 may communicate with mass data storage 623 that stores data in a nonvolatile manner such as optical and/or magnetic storage devices, for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". VoIP phone 620 may be connected to memory 629, which may be a RAM, ROM, low latency nonvolatile memory such as flash memory and/or other suitable electronic data storage. In one implementation, VoIP phone 620 is configured to establish communications link with a VoIP network (not shown) via Wi-Fi communication module 628.

The invention has been described above with respect to particular illustrative embodiments. It is understood that the invention is not limited to the above-described embodiments and that various changes and modifications may be made by those skilled in the relevant art without departing from the spirit and scope of the invention.

What is claimed is:

1. A method of testing a memory during runtime, the method comprising:
   receiving a test sequence during runtime;
   copying contents of a test region of the memory to a replacement memory;
   performing a test scan on the test region of the memory using the test sequence; and
   upon completion of the test scan, copying the contents of the test region stored in the replacement memory back into the test region of the memory.

2. The method of claim 1, further comprising storing the test sequence in a writable control store.

3. The method of claim 1, further comprising:
   receiving, by a controller from a processor unit, a memory segment start address and a memory segment end address from the processor unit,
   wherein the memory is scanned by the controller using a plurality of incremental test scans using the test sequence, the scanning of the memory starting at the memory segment start address and ending at the memory segment end address.

4. The method of claim 3, further comprising the controller waiting between individual test scans.

5. The method of claim 1, further comprising the controller receiving a loop count from the processor unit, wherein the test scan is repeated a plurality of times according to the loop count.

6. A controller for scan testing a memory, the controller comprising:
   a control state machine configured to (i) control a memory scan of the memory during runtime, (ii) copy contents of a test region of the memory into a replacement memory and (iii) copy the contents of the test region stored in the replacement memory back into the test region of the memory;
   a test state machine configured to perform a test scan on the test region of the memory using the test sequence; and
   a writable control store storing a test sequence used by a test state machine to test a test region of the memory,
   wherein the controller is configured to receive, from a processor unit, the test sequence for storing in the writable control store.

7. The controller of claim 6, further comprising:
   a pattern generation data unit responsive to the test state machine, the pattern generation data unit for generating a test pattern used by the test state machine to test the test region of the memory;
   a configuration register read by the control state machine; and
   a fault location register written to by the control state machine.

8. The controller of claim 6, wherein:
   the controller is further configured to receive, from the processor unit, a memory segment start address and a memory segment end address; and
   the control state machine is further configured to scan the memory using a plurality of incremental test scans using the test sequence, the scanning of the memory starting at the memory segment start address and ending at the memory segment end address.

9. The controller of claim 8, wherein the control state machine is further configured to wait between individual test scans.

10. The controller of claim 6, wherein:
    the controller is further configured to receive, from the processor unit, a loop count; and
    the control state machine is further configured to repeat the test scans for a plurality of times according to the loop count.

11. The controller of claim 10, wherein the control state machine is further configured to wait between individual test scans.

12. The controller of claim 6, wherein the controller is further configured to operate in a background mode.

13. A controller for testing a memory, the controller comprising:

means for receiving a test sequence during runtime;

means for copying contents of a test region of the memory to a replacement memory;

means for performing a test scan on the test region of the memory using the test sequence; and means for copying the contents of the test region stored in the replacement memory back into the test region of memory.

14. The controller of claim 13, further comprising means for storing the test sequence in a writable control store.

15. The controller of claim 13, further comprising:

means for receiving a memory segment start address and a memory segment end address, wherein the memory is scanned using a plurality of incremental test scans using the test sequence starting at the memory segment start address and ending at the memory segment end address.

16. The controller of claim 15, further comprising means for waiting between individual test scans.

17. The controller of claim 16, further comprising means for receiving a loop count, wherein the test scan is repeated a plurality of times according to the loop count.

18. The controller of claim 13, further comprising means for performing the memory scan in a background mode.

* * * * *